US 9,953,963 B2

(12) United States Patent
Chen et al.

(10) Patent No.: US 9,953,963 B2
(45) Date of Patent: Apr. 24, 2018

(54) INTEGRATED CIRCUIT PROCESS HAVING ALIGNMENT MARKS FOR UNDERFILL

(71) Applicant: Taiwan Semiconductor Manufacturing Company, Ltd., Hsin-Chu (TW)

(72) Inventors: Hsien-Wei Chen, Hsin-Chu (TW); An-Jhih Su, Bade (TW); Wei-Yu Chen, New Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 18 days.

(21) Appl. No.: 14/935,141

(22) Filed: Nov. 6, 2015

(65) Prior Publication Data

US 2017/0133354 A1 May 11, 2017

(51) Int. Cl.
*H01L 25/10* (2006.01)
*H01L 21/56* (2006.01)
*H01L 25/00* (2006.01)

(52) U.S. Cl.
CPC .......... *H01L 25/105* (2013.01); *H01L 21/563* (2013.01); *H01L 25/50* (2013.01); *H01L 2224/18* (2013.01); *H01L 2224/48091* (2013.01); *H01L 2225/1058* (2013.01); *H01L 2225/1082* (2013.01)

(58) Field of Classification Search
CPC ....... H01L 2924/00014; H01L 2924/00; H01L 2224/97; H01L 2224/32225; H01L 2224/73204; H01L 2924/15311; H01L 2224/16225; H01L 2924/12042; H01L 2924/014; H01L 2924/01029

USPC ......... 438/113, 107, 124, 106; 257/E21.502, 257/77; 14/113, 107, 124, 106
See application file for complete search history.

(56) References Cited

U.S. PATENT DOCUMENTS

| | | | |
|---|---|---|---|
| 7,642,662 B2 * | 1/2010 | Kasuga | H01L 23/544 257/686 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2009/0123747 A1* | 5/2009 | Fujimaru | C09J 163/00 428/355 EP |
| 2011/0147945 A1* | 6/2011 | Yoshida | H01L 21/561 257/774 |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |

(Continued)

*Primary Examiner* — Jonathan Han
(74) *Attorney, Agent, or Firm* — Slater Matsil, LLP

(57) ABSTRACT

Packages having alignment marks and methods of forming the same are provided. A first workpiece is attached to a second workpiece. The first workpiece has an alignment mark. Underfill is deposited at a location adjacent to the first workpiece. The location of underfill deposition is based at least in part on the alignment mark. The underfill is also cured.

20 Claims, 8 Drawing Sheets

(56) References Cited

U.S. PATENT DOCUMENTS

| | | | |
|---|---|---|---|
| 2013/0149841 A1* | 6/2013 | Indyk | H01L 24/29 |
| | | | 438/462 |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2014/0284780 A1* | 9/2014 | Kinoshita | H01L 23/544 |
| | | | 257/676 |
| 2014/0374922 A1* | 12/2014 | Huang | H01L 23/3128 |
| | | | 257/777 |
| 2015/0262878 A1* | 9/2015 | Sato | H01L 25/074 |
| | | | 257/777 |

* cited by examiner

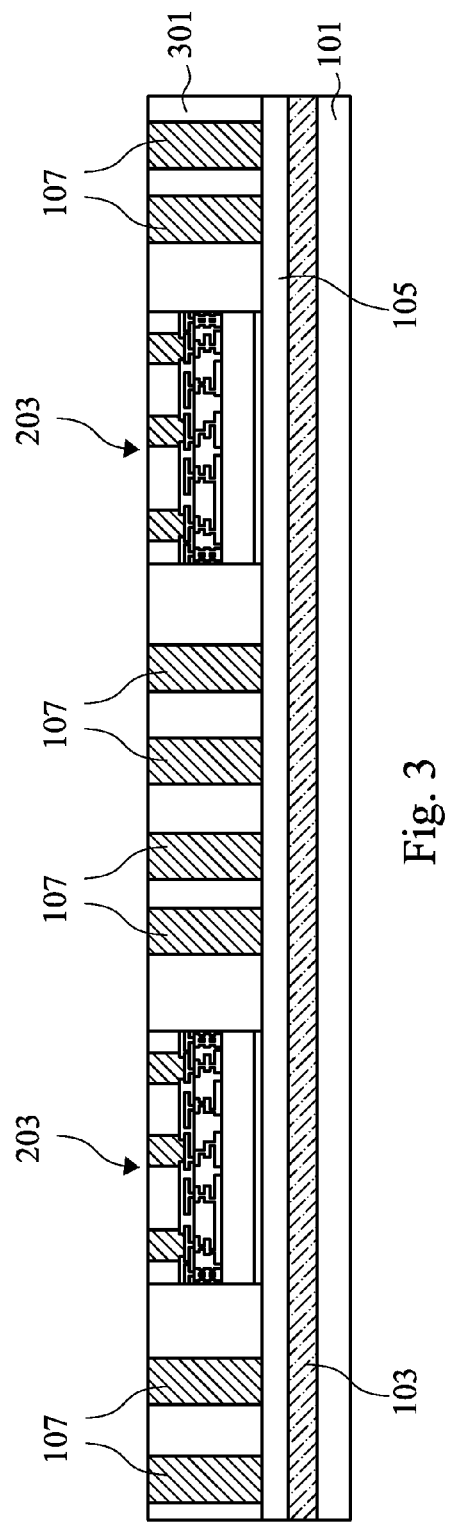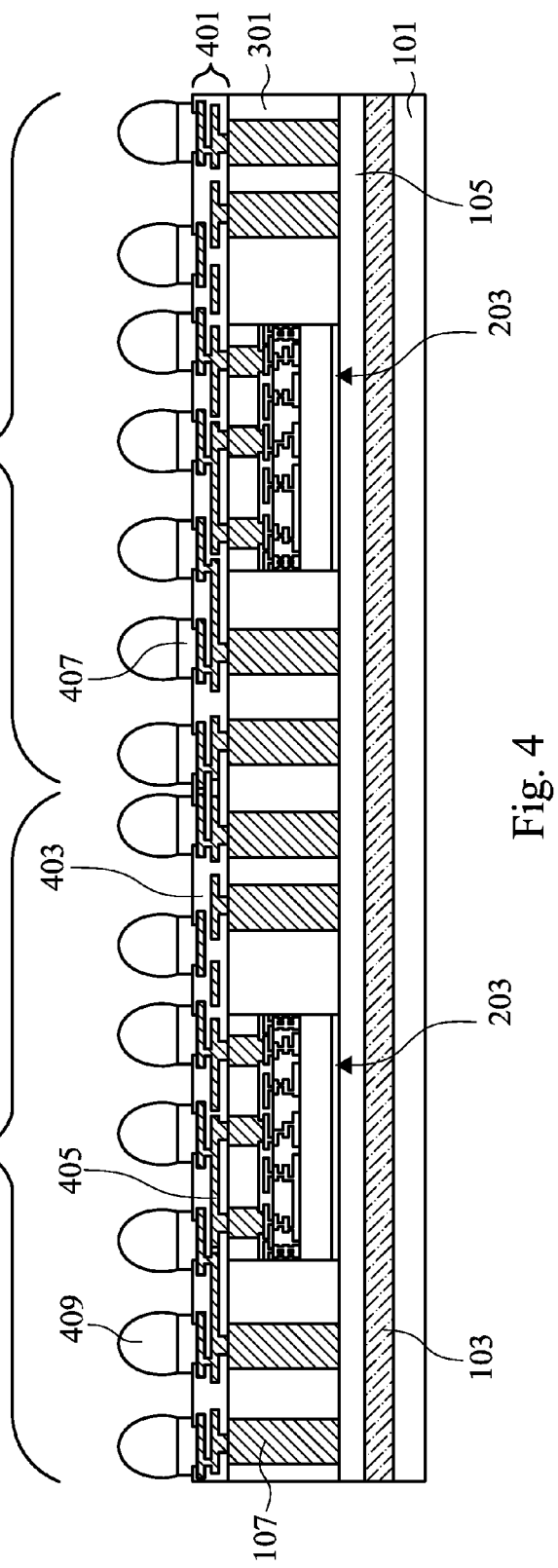

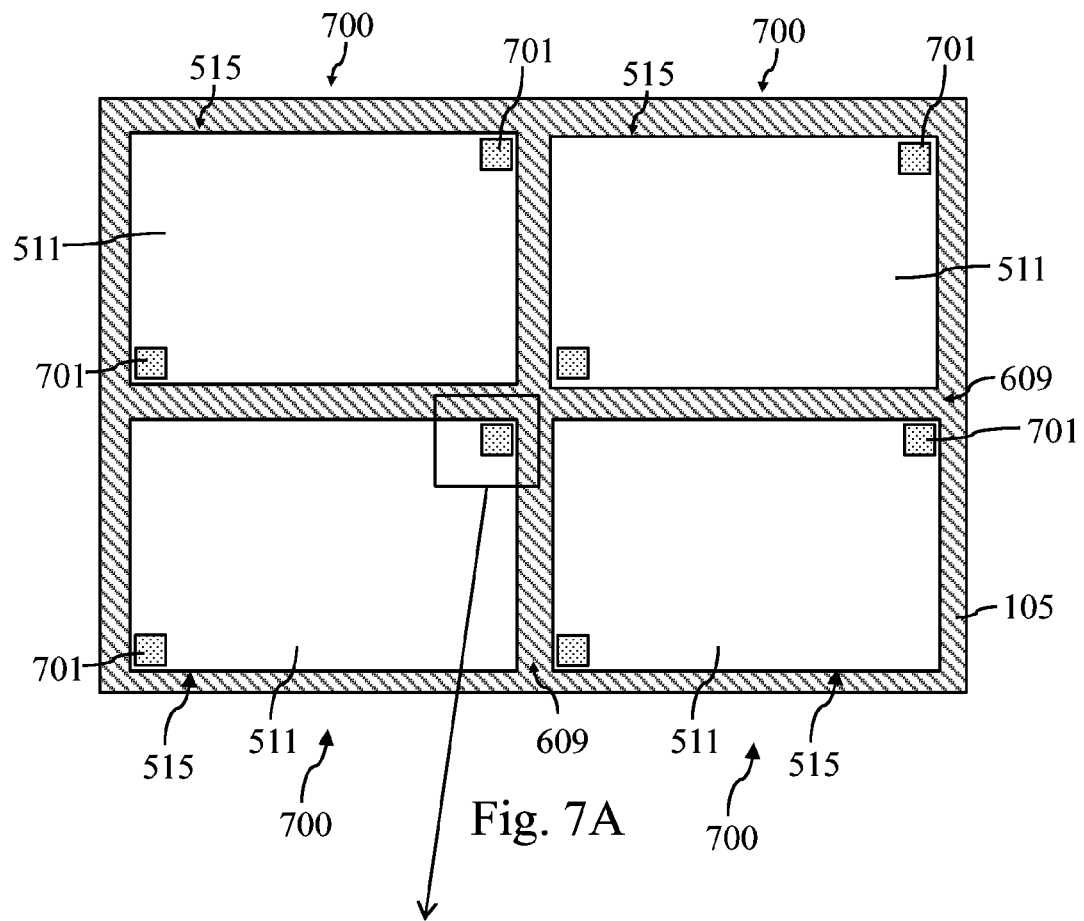
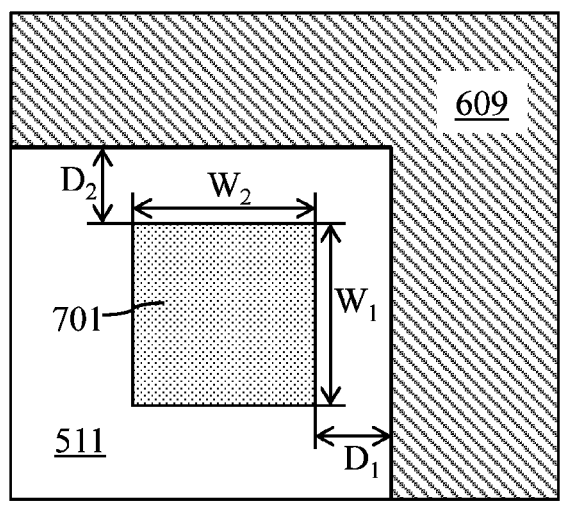
Fig. 7A
Fig. 7B

INTEGRATED CIRCUIT PROCESS HAVING ALIGNMENT MARKS FOR UNDERFILL

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (PoP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-6 are cross-sectional views of various processing steps during fabrication of stacked semiconductor devices having one or more alignment marks in accordance with some embodiments.

FIGS. 7A-7B are top views of stacked semiconductor devices having one or more alignment marks in accordance with some embodiments.

DETAILED DESCRIPTION

Figure 1:
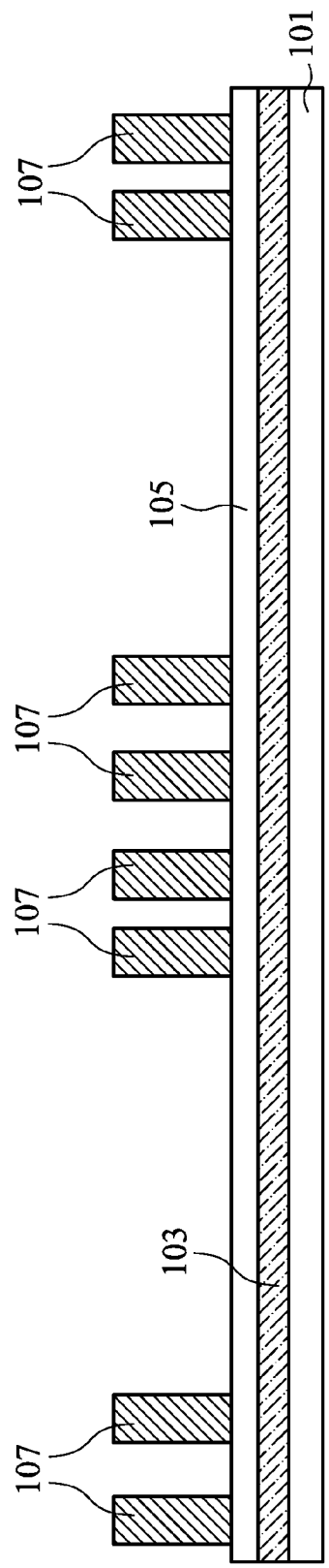

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the disclosed embodiments will be addressed generally. Described below are various stacked semiconductor devices having alignment marks and methods for forming such stacked semiconductor devices. The alignment marks may be used to assist subsequent processing, such as an underfill injection process.

In some embodiments, an upper stacked device and a lower stacked device may appear similar and/or have poor contrast. For example, in a PoP device, a Dynamic Random Access Memory (DRAM) molding and an Integrated Fan-Out (InFO) molding may be too similar in appearance for accurate automatic underfill alignment. Cases like these may sometimes require manual alignment of an underfill injection process, which may reduce efficiency and increase cost. The current disclosure describes embodiments related to alignment marks formed in the upper stacked device to assist in an automatic underfill alignment process. For example, the alignment marks may have more contrast than the contrast between the upper device and the lower device such that an automatic underfill alignment process may be used. Additionally, the alignment marks may be formed using, for example, a laser drill, which does not add significant processing or cost.

FIGS. 1-6 are cross-sectional views of various exemplary processing steps during fabrication of stacked semiconductor devices in accordance with some embodiments. One skilled in the art will appreciate that the processing steps as described below are provided for illustration only and that other processes may be used.

Referring first to FIG. 1, in some embodiments, a release layer 103 is formed over a carrier 101, and one or more dielectric layers 105 are formed over the release layer 103 to start forming integrated circuit packages. In some embodiments, the carrier 101 may be formed of quartz, glass, or the like, and provides mechanical support for subsequent operations. In some embodiments, the release layer 103 may comprise a light to heat conversion (LTHC) material, a UV adhesive, or the like, and may be formed using a spin-on coating process, a printing process, a lamination process, or the like. In some embodiments, the release layer 103 formed of a LTHC material partially or fully loses its adhesive strength when exposed to light and the carrier 101 can be easily removed from a back side of a subsequently formed structure. In some embodiments, the one or more dielectric layers 105 may be formed using one or more layers of photo-patternable dielectric materials such as polybenzoxazole (PBO), polyimide (PI), benzocyclobutene (BCB), or the like, and may be formed using a spin-on coating process, or the like. Such photo-patternable dielectric materials may be patterned using similar photolithography methods as a photoresist material. In other embodiments, the dielectric layers 105 may comprise one or more layers of non-photo-patternable dielectric materials such as silicon nitride, silicon oxide, phosphosilicate glass (PSG), borosilicate glass (BSG), boron-doped phosphosilicate glass (BPSG), or the like, and may be formed using chemical vapor deposition (CVD), PVD, ALD, a spin-on coating process, the like, or a combination thereof.

Referring further to FIG. 1, conductive vias 107 are formed on the one or more dielectric layers 105. In some embodiments, a seed layer (not shown) is formed on the one or more dielectric layers 105. The seed layer may comprise copper, titanium, nickel, gold, the like, or a combination thereof, and may be formed using an electro-chemical plating process, ALD, PVD, sputtering, the like, or a combination thereof. In some embodiments, a sacrificial layer (not shown) is formed over the seed layer. A plurality of openings is formed in the sacrificial layer to expose portions of the seed layer. In some embodiments wherein the sacrificial layer comprises a photoresist material, the sacrificial layer may be patterned using suitable photolithography methods. In some embodiments, the openings of the sacrificial layer are filled with a conductive material such as copper, aluminum, nickel, gold, silver, palladium, the like, or a combination thereof using an electro-chemical plating process, an electroless plating process, ALD, PVD, the like, or a combination thereof to form the conductive vias 107. After the formation of the conductive vias 107 is completed, the sacrificial layer is removed. In some embodiments wherein the sacrificial layer comprises a photoresist material, the sacrificial layer may be removed using, for example, an ashing process followed by a wet clean process. Subsequently, exposed portions of the seed layer are removed using, for example, a suitable etching process.

Figure 2:
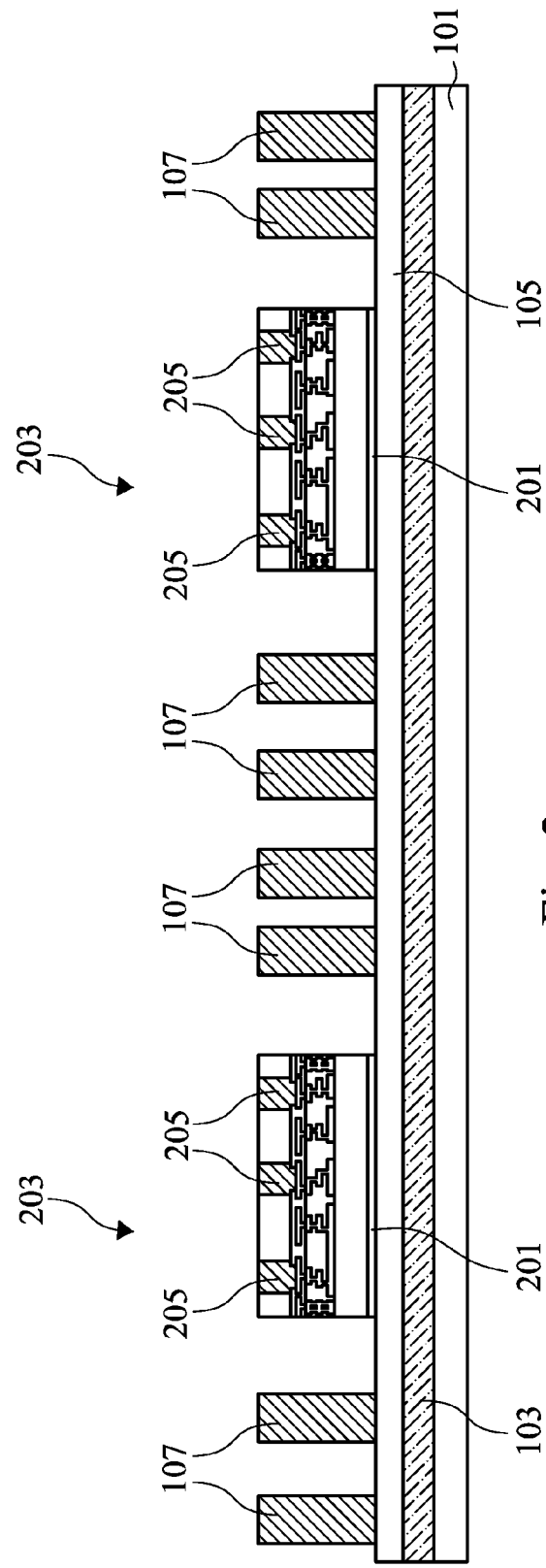

Referring to FIG. 2, device dies 203 are attached to the one or more dielectric layers 105 using adhesive layers 201. In some embodiments, the device dies 203 are placed on the one or more dielectric layers 105 using, for example, a pick-and-place apparatus. In other embodiments, the device dies 203 may be placed on the one or more dielectric layers 105 manually, or using any other suitable method. In some embodiments, the adhesive layer 201 may comprise an LTHC material, a UV adhesive, a die attach film, or the like, and may be formed using a spin-on coating process, a printing process, a lamination process, or the like.

In some embodiments, device dies 203 may include one or more active and/or passive devices. The active and/or passive devices may include various n-type metal-oxide semiconductor (NMOS) and/or p-type metal-oxide semiconductor (PMOS) devices such as transistors, capacitors, resistors, diodes, photo-diodes, fuses and/or the like. In some embodiments, the device dies 203 may be discrete integrated circuit dies, discrete semiconductor device chips (sometimes referred to as surface mount devices (SMDs), or integrated passive devices (IPDs)). In such embodiments, device dies 203 may include various devices such as RLC circuits, capacitors, inductors, transformers, baluns, micro-stripes, co-planar waveguides, or the like, and may be substantially free of active devices. In some embodiments, device dies 203 may be memory dies such as Static Random Access Memory (SRAM) dies, Dynamic Random Access Memory (DRAM) dies, or the like.

One skilled in the art will recognize that the number of passivation layers, contact pads, and the connectors is provided for illustrative purposes only and is not limiting the scope of the present disclosure. In other embodiments, each of the device dies 203 may comprise an appropriate number of passivation layers, contact pads, and connectors depending on design requirements for the device dies 203.

In some embodiments, the device dies 203 are mounted to the one or more dielectric layers 105 such that die contacts 205 are facing away from or distal to the one or more dielectric layers 105. The die contacts 205 provide an electrical connection to the electrical circuitry formed on the device dies 203. The die contacts 205 may be formed on active sides of the device dies 203, or may be formed on backsides and comprise through vias. The die contacts 205 may further comprise through vias providing an electrical connection between first sides and second sides of the device dies 203. In some embodiments, the die contacts 205 may comprise copper, tungsten, aluminum, silver, gold, tin, a combination thereof, or the like.

Referring to FIG. 3, an encapsulant 301 is formed over the carrier 101, and over and surrounding the device dies 203 and the conductive vias 107. In some embodiments, the encapsulant 301 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the device dies 203 and the conductive vias 107.

Referring further to FIG. 3, in some embodiments, a resulting structure is planarized using a CMP process, a grinding process, the like, or a combination thereof. In some embodiment, the planarization process is performed until the die contacts 205 of the device dies 203 are exposed. In some embodiments, the top surfaces of the die contacts 205 are substantially coplanar with top surfaces of the conductive vias 107 and the encapsulant 301.

Referring to FIG. 4, one or more redistribution layers (RDLs) 401 are formed over the device dies 203, the conductive vias 107 and the encapsulant 301. In some embodiments, the RDLs 401 comprise one or more dielectric layers 403 and one or more conductive features 405 disposed within the one or more dielectric layers 403. In some embodiments, the one or more dielectric layers 403 may comprise dielectric materials such as polybenzoxazole (PBO), polyimide (PI), benzocyclobutene (BCB), or the like, and may be formed using a spin-on coating process, or the like. In some embodiments, the one or more conductive features 405 may comprise copper, tungsten, aluminum, silver, gold, the like, or a combination thereof, may be formed using an electro-chemical plating process, an electroless plating process, ALD, PVD, the like, or a combination thereof.

Referring further to FIG. 4, underbump metallizations (UBMs) 407 are formed over and electrically coupled to the RDLs 401. In some embodiments, a set of openings may be formed through a topmost dielectric layer (not individually shown) of the one or more dielectric layers 403 to expose the one more conductive features 405 of the RDLs 401. In some embodiments, the UBMs 407 may include multiple layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 407. Any suitable materials or layers of material that may be used for the UBMs 407 are fully intended to be included within the scope of the current disclosure. In some embodiments, connectors 409 are formed over and electrically coupled to some of the UBMs 407. Connectors 409 may be solder balls, controlled collapse chip connection (C4) bumps, ball grid array (BGA) balls, micro bumps, electroless nickel-electroless palladium-immersion gold technique (ENEPIG) formed bumps, or the like. In some embodiments in which the connectors 409 are solder bumps, the connectors 409 may be formed by initially forming a layer of solder through commonly used methods such as evaporation, electroplating, printing, solder transfer, ball placement, or the like. Once the layer of solder has been formed, a reflow may be performed in order to shape the material into the desired bump shapes. In this manner, multiple integrated circuit dies 415 may be formed that include the device dies 203. In some embodiments, the integrated circuit dies 415 are formed as an integrated fan-out (InFO) structure.

Figure 5A:
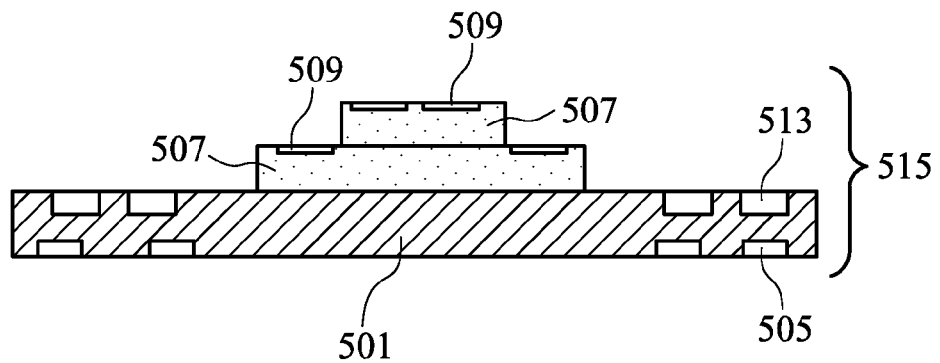
Figure 5B:
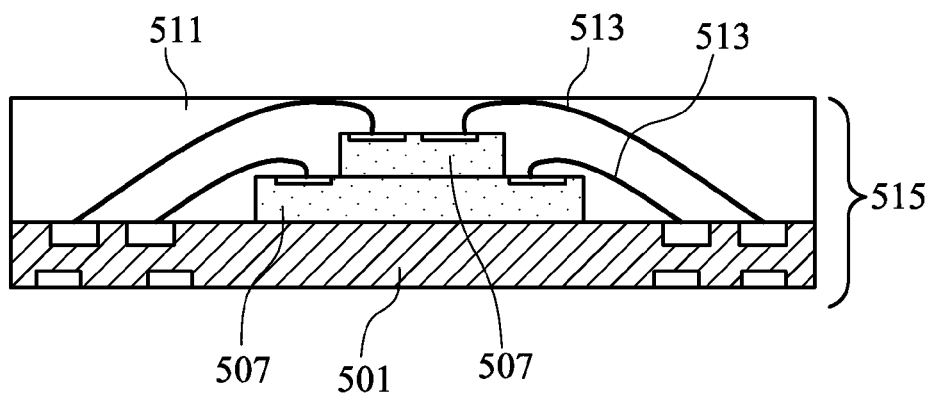
Figure 5C:
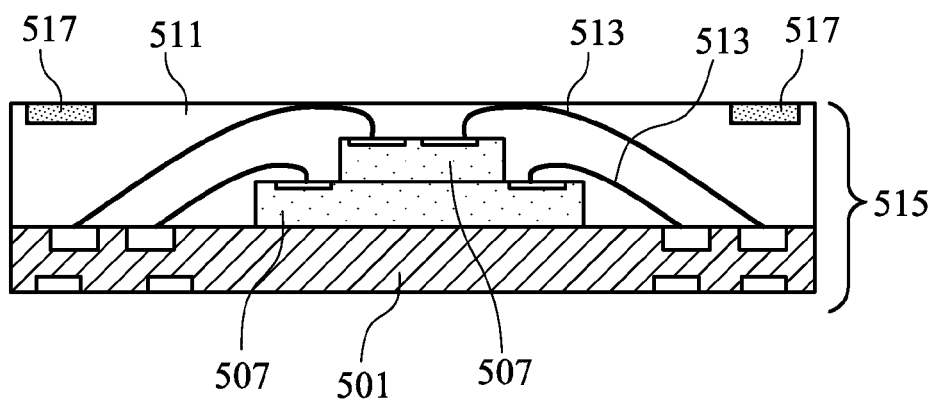

FIGS. 5A-5C illustrate various exemplary processing steps during fabrication of an example workpiece 515 in accordance with some embodiments. As will be discussed in greater detail below, the workpiece 515 is formed to include alignment marks, which will be used to aid in the alignment of workpiece 515 when connecting to the connectors 409 (see FIG. 4). The example workpiece 515 is an integrated circuit package that includes a substrate 501 and one or more stacked dies 507 coupled to the substrate 501.

FIG. 5A shows two stacked dies 507 bonded to a substrate 501. In various embodiments, the substrate 501 may be a substrate, a packaging substrate, a silicon substrate, an organic substrate, a ceramic substrate, a laminate substrate, an interposer, an integrated circuit, a packaged die or the like. In various embodiments, bond pads 503, 505 may be formed of copper, aluminum, gold, tungsten, alloys thereof or the like.

Figure 6:
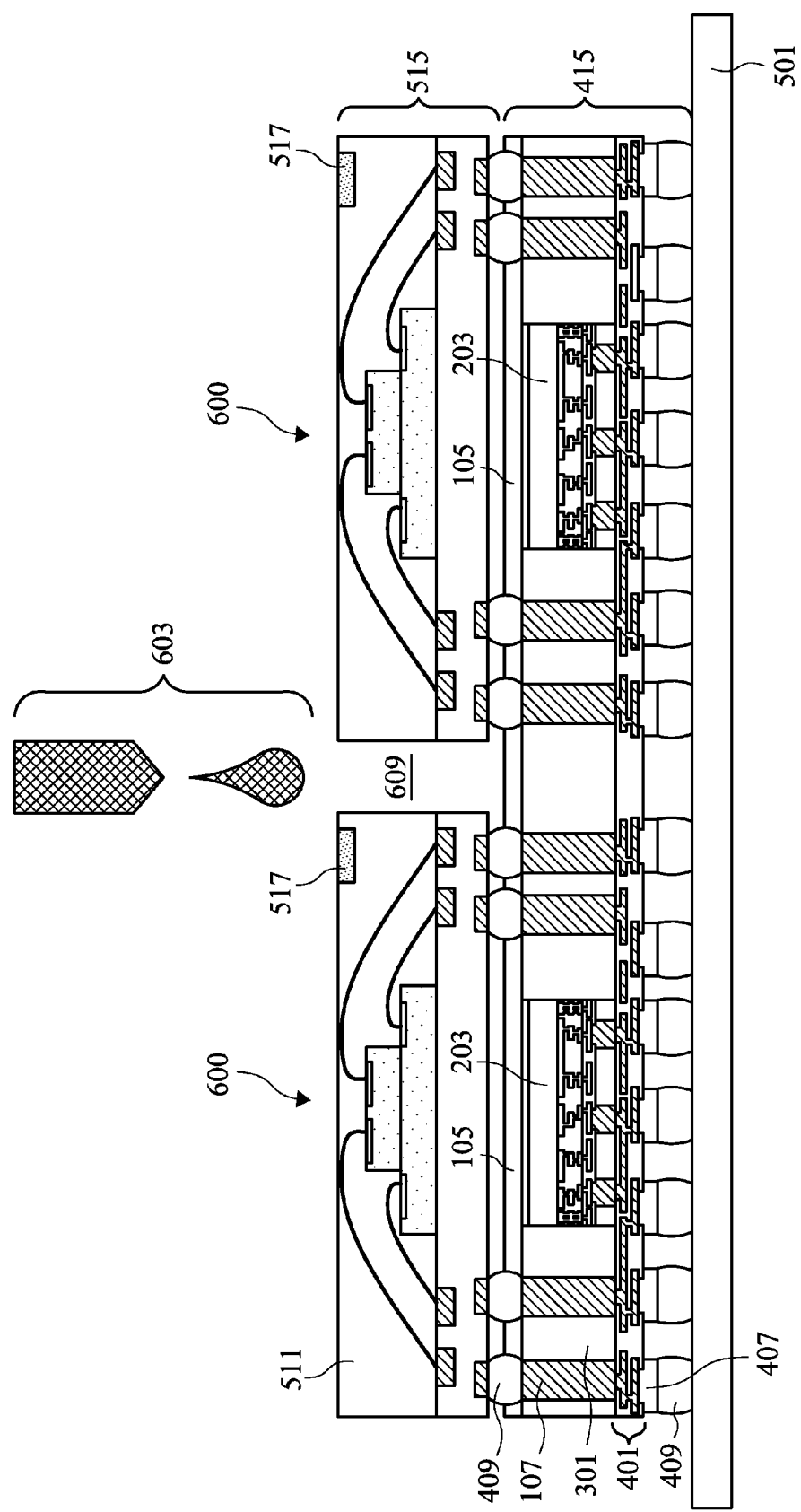

In some embodiments, stacked dies 507 may be bonded to the substrate 501, forming a workpiece 515. FIGS. 5A-6 show two stacked dies 507, but in other embodiments more or fewer stacked dies 507 are used. In some embodiments, the workpiece 515 includes no stacked dies 507. The stacked dies 507 may be of types similar to those of the device dies 203 described above and the descriptions are not repeated herein, although the stacked dies 507 need not be the same types. In some embodiments, the workpiece 515 may include device dies, integrated circuit dies, memory dies, an interposer, an integrated circuit package, wafer-level packaging, and/or other types of dies or structures.

FIG. 5B shows the stacked dies 507 electrically coupled to the substrate 501 with contact pads 509 and wire bonds 513. In other embodiments, other connections may be used, such as conductive bumps. In some embodiments, the stacked dies 507 and the wire bonds 513 may be encapsulated by a molding material 511, as shown in FIG. 5B. The molding material 511 may be molded on the stacked dies 507 and the wire bonds 513, for example, using compression molding. In some embodiments, the molding material 511 is a molding compound, a polymer, an epoxy, silicon oxide filler material, the like, or a combination thereof. A curing step may be performed to cure the molding material 511, wherein the curing may be a thermal curing, a UV curing, the like, or a combination thereof. In some embodiments, the stacked dies 507 and the wire bonds 513 are buried in the molding material 511, and after the curing of the molding material 511, a planarization step, such as a grinding, is performed to remove excess portions of the molding material 511 and provide a substantially planar surface for the workpiece 515.

Referring now to FIG. 5C, one or more alignment marks 517 may be formed in the workpiece 515. In some embodiments, the alignment marks 517 are formed in the molding material 511 of the workpiece 515. In some embodiments, the alignment marks 517 are formed using a laser drilling process, an etching process, a grinding process, a metal or dielectric deposition process, or using another process. In the illustrative embodiment shown in FIGS. 5C-6, the alignment marks 517 have been formed using a laser drilling process. A single workpiece 515 may have multiple alignment marks 517. For example, a workpiece 515 may have two, three, or another number of alignment marks 517. The alignment marks 517 may have specific sizes or may have one or more specific shapes, as described in greater detail below. In some embodiments, the alignment marks 517 are formed in the molding material 511 to a specific depth. For example, the alignment marks 517 may have a depth ranging from 10 μm to 30 μm, or another depth. In some cases, a particular alignment mark depth may provide sufficient contrast or enhanced contrast to facilitate underfill alignment, described in more detail below. In some embodiments, the alignment marks 517 are filled with a material such as a metal, a molding material, a dielectric, or another material. The alignment marks 517 may assist in the deposition of underfill, as described in greater detail below. In some embodiments, the alignment marks 517 are formed prior to singulation of the workpieces 515. In some embodiments, the alignment marks 517 are formed after the singulation of the workpieces 515.

Referring to FIG. 6, in some embodiments, multiple workpieces 515 are bonded to the integrated circuit dies 415, forming stacked semiconductor devices 600. In some embodiments, a gap 609 may be present between adjacent workpieces 515. In some embodiments, the integrated circuit dies 415 may be bonded to workpiece 515 using the connectors 409. In some embodiments, the workpiece 515 may be an integrated circuit package, one or more dies, a package substrate, an interposer, a PCB, or the like. In some embodiments, the workpiece 515 is a package, and the stacked semiconductor device 600 is a package-on-package (PoP) device or an integrated fan-out package-on-package (InFO-PoP) device. In other embodiments wherein the workpiece 515 is a die, the stacked semiconductor device 600 is a chip-on-package (CoP) device. In some embodiments, the alignment marks 517 are formed on the workpieces 515 after the workpieces 515 have been bonded to the integrated circuit dies 415.

Referring further to FIG. 6, an underfill material may be injected or otherwise formed in the gap 609 between the workpiece 515 and the integrated circuit dies 415, and surrounding the connectors 409. The underfill injection is shown schematically in FIG. 6 as underfill injector 603. The underfill material may, for example, be a liquid epoxy, deformable gel, silicon rubber, or the like, that is dispensed between the structures, and then cured to harden. The underfill material may be used, among other things, to reduce damage to and to protect the connectors 409. In some embodiments, the underfill injector 603 determines the location of underfill injection based at least in part on the position and/or arrangement of the alignment marks 517. In some cases, the underfill injector 603 may inject underfill at a location that is a predetermined offset from an alignment mark 517 or at a location that is determined by the locations of two or more alignment marks 517. For example, in the case wherein two alignment marks 517 are located near opposite sides of a gap 609, the underfill injector 603 may inject underfill at a location about halfway between the two alignment marks 517. The underfill injector 603 may inject underfill at a single location or at multiple locations relative to each workpiece 515. The underfill injector 603 may include multiple injectors, and may inject underfill in multiple locations sequentially and/or simultaneously. In some embodiments, the underfill injector 603 may inject underfill based on other properties of an alignment mark 517 including the size of the alignment mark, the number of alignment marks, the length of an alignment mark, the shape of the alignment mark, or other properties of the alignment mark.

FIGS. 7A-9B are top views of stacked semiconductor devices having alignment marks in accordance with some embodiments, wherein an "A" figure represents a top view and a "B" figure represents close-up view of an alignment mark within the corresponding "A" figure. The stacked semiconductor devices are shown prior to underfill injection, similar to stacked semiconductor devices 600 shown in cross-section in FIGS. 1-6. In some embodiments, the stacked semiconductor devices may be formed using similar materials and methods as the stacked semiconductor devices 600 described above with reference to FIGS. 1-6, with similar elements labeled with similar numerical references, and the description is not repeated herein. In some embodiments, the alignment marks may be formed in a manner similar to alignment marks 517 shown in FIG. 5C. In some embodiments, each workpiece may include two alignment marks. In other embodiments, more or fewer than two alignment marks may be formed in each workpiece. In other embodiments, alignment marks may be formed in different locations on the workpieces than those shown in FIGS. 7A-9B. For example, each workpiece may include a single alignment mark at a single corner. As another example, each workpiece may include one or more alignment marks at each corner. Other arrangements of alignment marks are possible than those described herein. FIGS. 7A-9B show illustrative examples of alignment marks. In other embodiments, alignment marks may have circular shapes, oval shapes, polygonal shapes, irregular shapes, or other shapes.

FIGS. 7A-7B show an example stacked semiconductor devices 700. In the illustrated embodiment of stacked semiconductor device 700, the top-view shape of the alignment marks 701 is rectangular. The illustrated embodiment shows two alignment marks 701 on each workpiece 515, each formed in the molding 511 at opposing corners. In some embodiments, a rectangular alignment mark 701 may have a first side separated from a first edge of the molding 511 (or a first edge of the workpiece 515) by a first distance $D_1$ and a second side separated from a second edge by a second distance $D_2$. In some embodiments, $D_1$ and $D_2$ are equal. In some embodiments, $D_1$ and/or $D_2$ may be between about 50 μm and about 200 μm. In some embodiments, a first side of the alignment mark 701 has a first width $W_1$ and a second side has a second width $W_2$. In some embodiments, $W_1$ and $W_2$ are equal. In some embodiments, $W_1$ and/or $W_2$ may be between about 50 μm and about 200 μm.

Figure 8A:
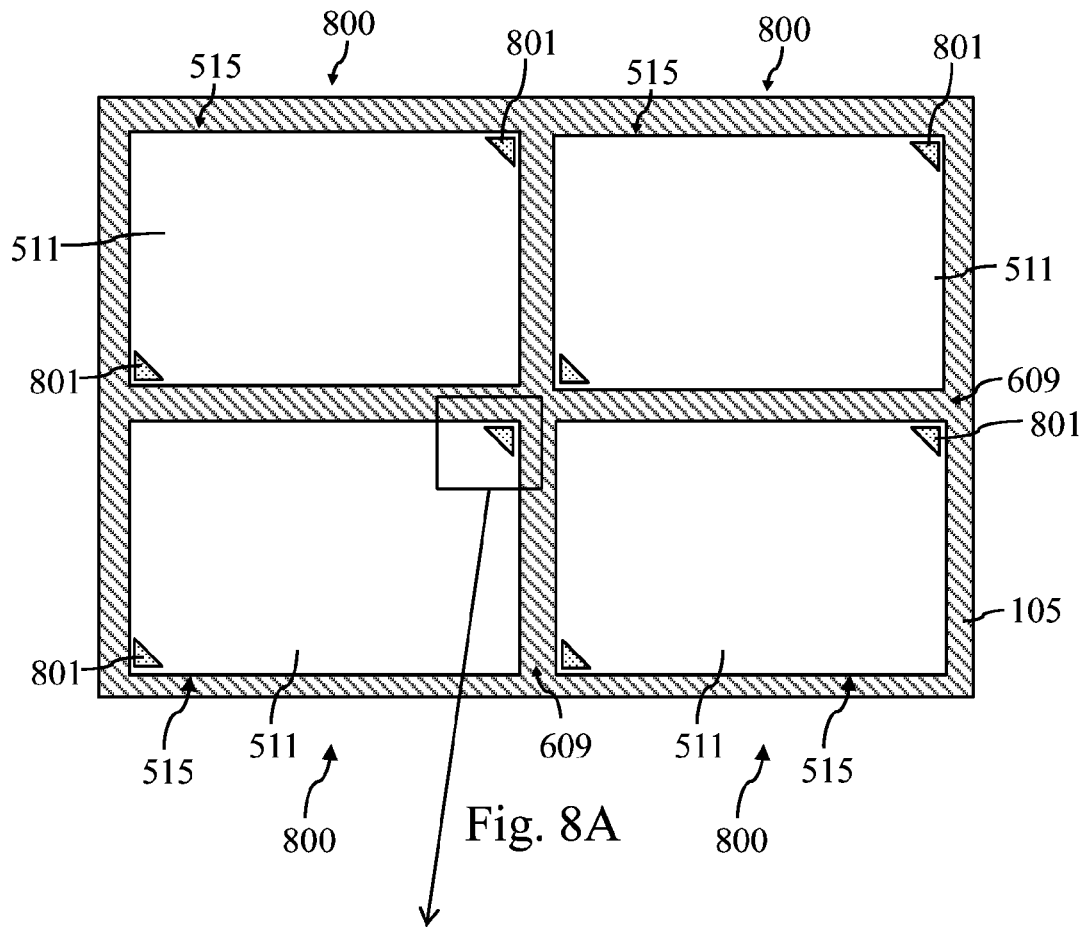
FIGS. 8A-8B are top views of stacked semiconductor devices having one or more alignment marks in accordance with some embodiments.
Figure 8B:
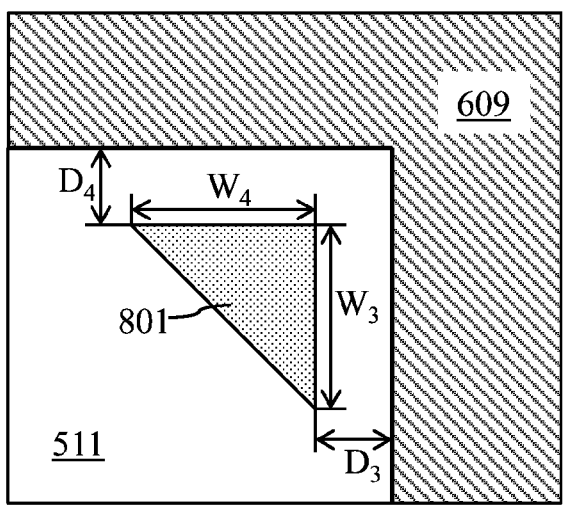

FIGS. 8A-8B show an example stacked semiconductor devices 800. In the illustrated embodiment of stacked semiconductor device 800, the top-view shape of the alignment marks 801 is triangular. The illustrated embodiment shows two alignment marks 801 on each workpiece 515, each formed in the molding 511 at opposing corners. In some embodiments, a triangular alignment mark 801 may have a first side separated from a first edge of the molding 511 (or the workpiece 515) by a first distance $D_3$ and a second side separated from a second edge by a second distance $D_4$. In some embodiments, $D_3$ and $D_4$ are equal. In some embodiments, $D_3$ and/or $D_4$ may be between about 50 μm and about 200 μm. In some embodiments, a first side of the alignment mark 801 has a first width $W_3$ and a second side has a second width $W_4$. In some embodiments, $W_3$ and $W_4$ are equal. In some embodiments, $W_3$ and/or $W_4$ may be between about 50 μm and about 300 μm.

Figure 9A:
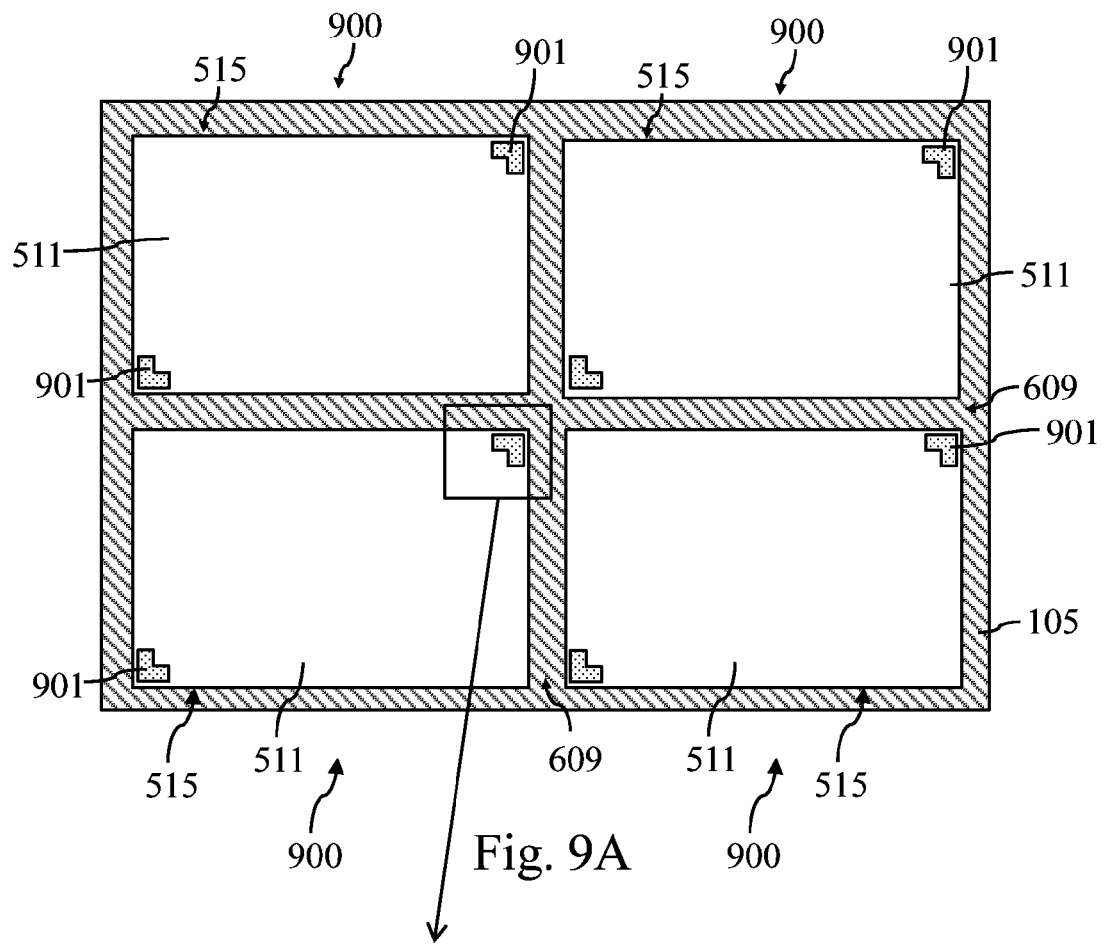
FIGS. 9A-9B are top views of stacked semiconductor devices having one or more alignment marks in accordance with some embodiments.
Figure 9B:
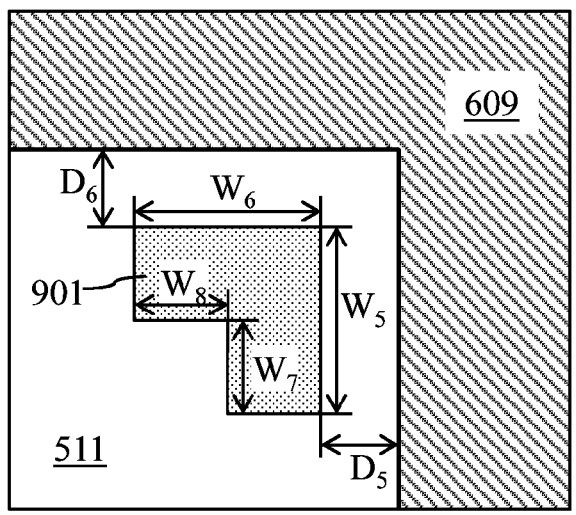

FIGS. 9A-9B show an example stacked semiconductor devices 900. In the illustrated embodiment of stacked semiconductor device 900, the top-view shape of the alignment marks 901 is L-shaped. The illustrated embodiment shows two alignment marks 901 on each workpiece 515, each formed in the molding 511 at opposing corners. In some embodiments, an L-shaped alignment mark 901 may have a first side separated from a first edge of the molding 511 (or the workpiece 515) by a first distance $D_5$ and a second side separated from a second edge by a second distance $D_6$. In some embodiments, $D_5$ and $D_6$ are equal. In some embodiments, $D_5$ and/or $D_6$ may be between about 50 μm and about 200 μm. In some embodiments, a first side of the alignment mark 901 has a first width $W_5$ and a second side has a second width $W_6$. In some embodiments, $W_5$ and $W_6$ are equal. In some embodiments, $W_5$ and/or $W_6$ may be between about 50 μm and about 300 μm. In some embodiments, the "inner" sides of the alignment mark 901 may have a third width $W_7$ and a fourth width $W_8$. In some embodiments, $W_7$ and $W_8$ are equal. In some embodiments, $W_7$ and/or $W_8$ may be about half the width of $W_5$ and/or $W_6$.

Figure 10:
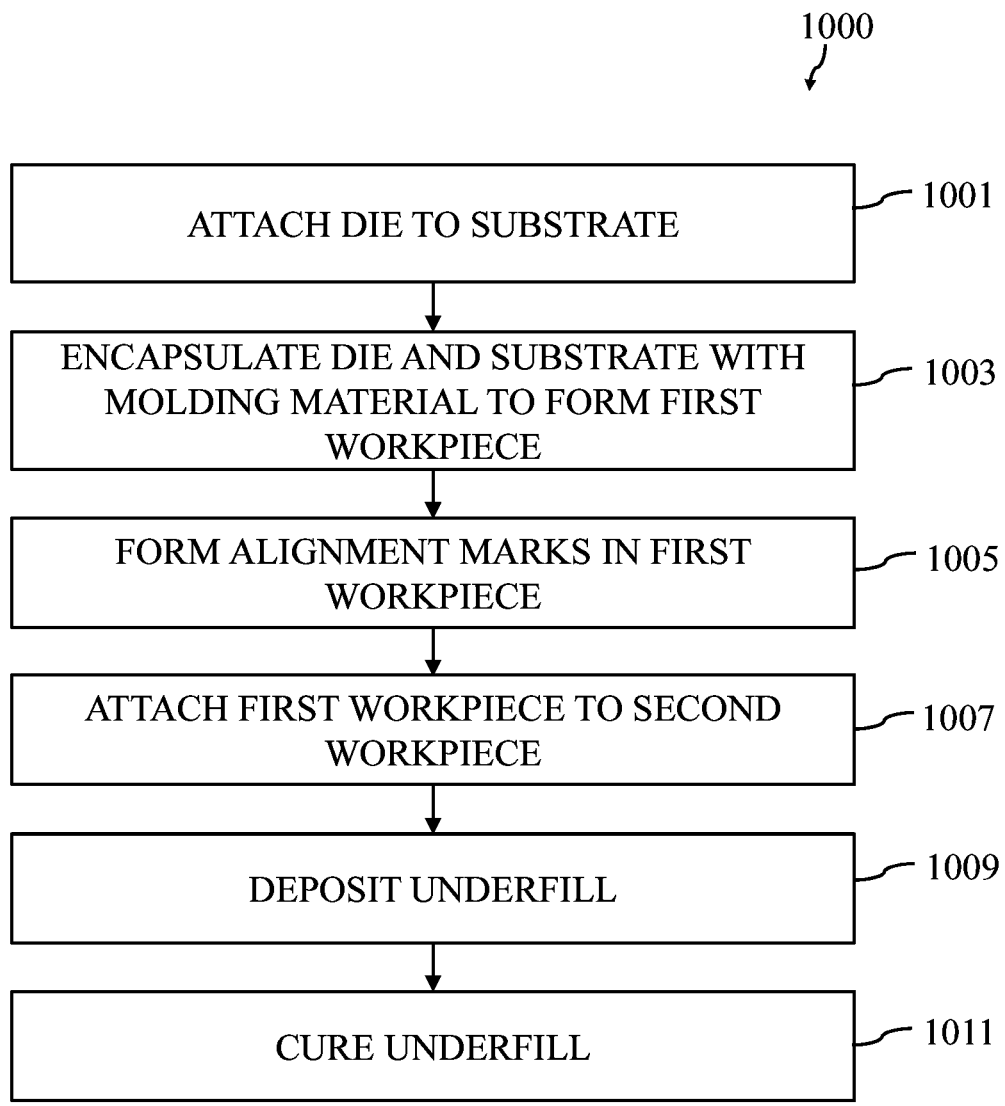
FIG. 10 is a flow diagram illustrating a method of forming stacked semiconductor devices having one or more alignment marks in accordance with some embodiments.

FIG. 10 is a flow diagram illustrating a method 1000 of forming integrated circuit packages in accordance with some embodiments. The method 1000 starts with step 1001, wherein one or more dies (such as the stacked dies 507) are attached to a substrate (such as substrate 501) as described above with reference to FIGS. 5A-C. In step 1003, an encapsulant (such as the molding material 511) is formed to encapsulate the dies and substrate as described above with reference to FIGS. 5A-5C. In some embodiments, encapsulating the dies and substrate forms a first workpiece, (such as first workpiece 515) as described above with reference to FIGS. 5A-C. In step 1005, one or more alignment marks (such as the one or more alignment marks 517, 701, 801, or 901) are formed in a first workpiece (such as the workpiece 515) as described above with reference to FIGS. 5A-C and FIGS. 7-9. In some embodiments the alignment marks are formed in the molding of the workpiece (such as molding 511) as described above with reference to FIGS. 5A-C and FIGS. 7-9. In some embodiments, workpieces are singulated after the alignment marks have been formed. In step 1007, the first workpiece is attached to a second workpiece (such as the integrated circuit dies 415) to form a stacked device (such as stacked semiconductor device 600) as described above with reference to FIG. 6. In step 1009, underfill is deposited as described above with reference to FIG. 6. In some embodiments, the underfill is deposited based on the location of one or more alignment marks. In step 1011, the underfill is cured as described above with reference to FIG. 6. In some embodiments, stacked devices are singulated after the underfill has been cured.

According to an embodiment, a method includes attaching a first workpiece to a second workpiece, the first workpiece having an alignment mark. Underfill is deposited at a location adjacent to the first workpiece, wherein the location of underfill deposition is based at least in part on the alignment mark. The method also includes curing the underfill.

According to another embodiment, a method includes attaching a die to a substrate. Multiple electrical connections are formed between the die and the substrate. The die and substrate are encapsulated in a molding material to form a package. An alignment mark is formed in the molding material of the package.

According to yet another embodiment, a first workpiece includes a substrate, and a die attached to the substrate. A molding material encapsulates the die and an alignment mark is formed in the molding material. A second workpiece is attached to the first workpiece.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   attaching a first workpiece to a second workpiece, the first workpiece having an alignment mark;
   attaching a third workpiece to the second workpiece, wherein the third workpiece is laterally adjacent the first workpiece;
   after attaching the first workpiece and the third workpiece to the second workpiece, determining a first location of the alignment mark;
   determining a second location between the first workpiece and the third workpiece, wherein determining the second location is based at least in part on the first location;
   depositing underfill from the second location to between the first workpiece and the second workpiece and to between the third workpiece and the second workpiece; and
   curing the underfill.

2. The method of claim 1, wherein the alignment mark is formed in a molding material of the first workpiece.

3. The method of claim 1, wherein the alignment mark has a triangular shape.

4. The method of claim 1, wherein the alignment mark is formed at a first corner of the top surface of the first workpiece.

5. The method of claim 4, wherein the alignment mark is a first alignment mark, and a second alignment mark is formed at a second corner of the top surface of the first workpiece opposite the first corner.

6. The method of claim 1, further comprising forming the alignment mark using laser drilling.

7. The method of claim 1, wherein an edge of the alignment mark is positioned about 50 µm to about 200 µm from an edge of the top surface of the first workpiece.

8. The method of claim 1, wherein the alignment mark has a side having a width of about 50 µm to about 300 µm.

9. The method of claim 1, wherein the third workpiece has another alignment mark.

10. The method of claim 1, wherein the first workpiece is a molded memory device die.

11. A method comprising:
    attaching a die to a substrate;
    forming a plurality of electrical connections between the die and the substrate;
    encapsulating the die and substrate in a molding material to form a package;
    forming an alignment mark in the molding material of the package;
    positioning an underfill injector at a first position relative to the package, the positioning based on a location of the alignment mark and a predetermined nonzero offset; and
    injecting underfill using the underfill injector while the underfill injector is positioned at the first position.

12. The method of claim 11, wherein the alignment mark is a first alignment mark and further comprising forming a second alignment mark on the molding material.

13. The method of claim 11, wherein the alignment mark is formed using laser drilling.

14. The method of claim 11, further comprising attaching the package to a workpiece.

15. The method of claim 11, wherein the alignment mark has a depth between 10 µm and 30 µm.

16. The method of claim 11, wherein the die comprises a molded memory device die.

17. A method comprising:
    forming a plurality of packages, wherein forming each package of the plurality of packages comprises:
       attaching a die to a substrate, the die being electrically connected to the substrate;
       encapsulating the die and substrate in a molding material to form a package; and
       forming an alignment mark in the molding material of the package;
    attaching the plurality of packages to a workpiece; and
    injecting underfill onto the workpiece from an injection location, the injection location based on a first location of a first alignment mark of a first package of the plurality of packages and a second location of a second alignment mark of a second package of the plurality of packages, wherein the injected underfill extends from the first package to the second package.

18. The method of claim 17, further comprising forming another alignment mark in the molding material of the package.

19. The method of claim 17, wherein the alignment mark is formed using laser drilling.

20. The method of claim 17, wherein the alignment mark is formed at a corner of the package.

* * * * *